(12) United States Patent
Jung (10) Patent No.: US 8,139,365 B2
(45) Date of Patent: Mar. 20, 2012

(54) FLAT PANEL DISPLAY MODULE

(75) Inventor: Ok-Sun Jung, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 895 days.

(21) Appl. No.: 12/219,745

(22) Filed: Jul. 28, 2008

(65) Prior Publication Data

US 2009/0033595 A1  Feb. 5, 2009

(30) Foreign Application Priority Data

Jul. 31, 2007  (KR) .................. 10-2007-0077157

(51) Int. Cl.
    *H05K 5/00* (2006.01)
(52) U.S. Cl. ........................................ 361/753
(58) Field of Classification Search .......... 361/730, 361/752, 796, 799, 807, 810
    See application file for complete search history.

(56) References Cited

U.S. PATENT DOCUMENTS

| | | | | |
|---|---|---|---|---|
| 5,861,873 A * | 1/1999 | Kikinis | ............... | 345/157 |
| 6,636,281 B1 * | 10/2003 | Kanatsu | ............... | 349/58 |
| 6,971,780 B2 * | 12/2005 | Lee et al. | ............... | 362/561 |
| 7,042,737 B1 * | 5/2006 | Woolsey et al. | ............... | 361/799 |
| 7,170,759 B2 * | 1/2007 | Soga | ............... | 361/825 |
| 7,225,239 B2 * | 5/2007 | King et al. | ............... | 709/220 |
| 7,656,666 B2 * | 2/2010 | Jeong | ............... | 361/704 |
| 7,782,631 B2 * | 8/2010 | Tien | ............... | 361/816 |
| 2006/0018106 A1 * | 1/2006 | Shoji et al. | ............... | 361/829 |
| 2006/0203461 A1 * | 9/2006 | Jung et al. | ............... | 361/816 |
| 2006/0244875 A1 * | 11/2006 | Ahn | ............... | 349/58 |
| 2006/0268193 A1 * | 11/2006 | Wang et al. | ............... | 349/59 |
| 2007/0139580 A1 * | 6/2007 | Zhang | ............... | 349/58 |
| 2008/0285222 A1 * | 11/2008 | Yeo et al. | ............... | 361/681 |

FOREIGN PATENT DOCUMENTS

| | | |
|---|---|---|
| KR | 10-2004-0023930 A | 3/2004 |
| KR | 10-2006-0119590 A | 11/2006 |
| KR | 10-2007-0046674 A | 5/2007 |
| KR | 10-2007-0055120 A | 5/2007 |

\* cited by examiner

*Primary Examiner* — Lisa Lea Edmonds
*Assistant Examiner* — Xanthia C Cunningham
(74) *Attorney, Agent, or Firm* — Lee & Morse, P.C.

(57) ABSTRACT

A flat panel display module includes a display panel, a chassis configured to support the display panel and having a chassis base and a first extending portion, the first extending portion being parallel to the display panel and extending away from the chassis base, the first extending portion including a seating portion having a predetermined depth, and a circuit board configured to drive the display panel, at least one part of the circuit board being mounted on the seating portion of the first extending portion.

20 Claims, 8 Drawing Sheets

FLAT PANEL DISPLAY MODULE

BACKGROUND OF THE INVENTION

1. Field of the Invention

Embodiments of the present invention relate to a flat panel display (FPD) module. More particularly, embodiments of the present invention relate to a FPD module having a chassis with a seating portion for connecting a circuit board thereto.

2. Description of the Related Art

Recently, many types of FPDs have been developed. Examples of these FPDs may include liquid crystal displays (LCDs), plasma display modules, field emission displays (FEDs), and vacuum fluorescent displays (VFDs). These FPDs have recently been spotlighted since they may be light weight, and may display high quality images in comparison to conventional cathode ray tubes (CRTs).

A conventional FPD may include a plurality of circuit boards to drive a display panel of the FPD. The conventional circuit board of the FPD may include a plurality of circuit elements, installation holes, and ground portions. Each ground portion may have a ring shape surrounding one installation hole and may be connected to ground circuit lines.

The conventional circuit board may be attached to a chassis with bolts and bosses. More specifically, each circuit board may be mounted on the bosses by inserting the bolts through the installation holes into the bosses, so a contact may be formed between each bolt and a ground portion surrounding the corresponding installation hole. The contact between each bolt and a corresponding ground portion may ground the circuit board.

However, when the bolts are inserted into the insertion holes, the ground portions surrounding the installation holes in the conventional circuit board may be damaged, so electrical contact between the bolts and the ground portions or between the bolts and the bosses may be reduced. When the electrical contact between the bolts and the ground portions or between the bolts and the bosses is reduced or is unstable, grounding of the circuit board may be inadequate.

In addition, the conventional FPD may require a large number of bosses, e.g., at least four bosses for each circuit board. The large number of bosses may minimize space efficiency on the chassis. Further, since the bosses may be forcibly inserted into the chassis, processes and costs for inserting a large number of bosses may be increased.

SUMMARY OF THE INVENTION

Embodiments of the present invention are therefore directed to a FPD module, which substantially overcomes one or more of the disadvantages and shortcomings of the related art.

It is therefore a feature of an embodiment of the present invention to provide a FPD module having a circuit board mounting structure capable of providing efficient grounding.

It is another a feature of an embodiment of the present invention to provide a FPD module having a circuit board mounting structure capable of providing efficient space utilization.

At least one of the above and other features and advantages of the present invention may be realized by providing a FPD module, including a display panel, a chassis configured to support the display panel and having a chassis base and at least one first extending portion attached to the chassis base, the first extending portion being parallel to the display panel and extending away from the chassis base, the first extending portion including a seating portion having a predetermined depth, and a circuit board configured to drive the display panel, at least one part of the circuit board being mounted on the seating portion of the first extending portion. The display panel may be a plasma display panel. The circuit board may be an address electrode buffer circuit board.

The circuit board may be mounted on the seating portion with bolts. The first extending portion may include mounting holes, each mounting hole including a thread on at least a portion of an inner circumferential surface thereof, and the bolts being screwed into the mounting holes. The circuit board may include installation grooves, and the first extending portion may include mounting grooves corresponding to the installation grooves, the mounting grooves being connected to the mounting holes. The circuit board may include installation holes corresponding to the mounting holes. At least a part of each of the mounting holes may be in the seating portion.

The circuit board may include a circuit ground portion, the circuit ground portion being in contact with the seating portion. The circuit ground portion may be in direct contact with the seating portion. The circuit ground portion may be in direct contact with a grounding portion on a surface of the seating portion. The predetermined depth of the seating portion may substantially equal a thickness of the circuit board. The first extending portion may be a reinforcing member on a rear surface of the chassis base opposite a front surface of the chassis base, the front surface supporting the display panel. The reinforcing member may have a step structure. The FPD module may further include a second extending portion, the second extending portion including a seating portion. The second extending portion may be opposite the first extending portion. At least a part of the circuit board may be mounted on the seating portion of the second extending portion. The seating portion may include first and second surfaces, the first and second surfaces being perpendicular to each other. The circuit board mounted on the seating portion of the first extending portion may be in direct contact with both the first and second surfaces of the seating portion. A rear surface of the circuit board may be level with a rear surface of the first extending portion. The first extending portion may be integral with the chassis base.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0077157, filed on Jul. 31, 2007, in the Korean Intellectual Property Office, and entitled: "Flat Panel Display Module," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
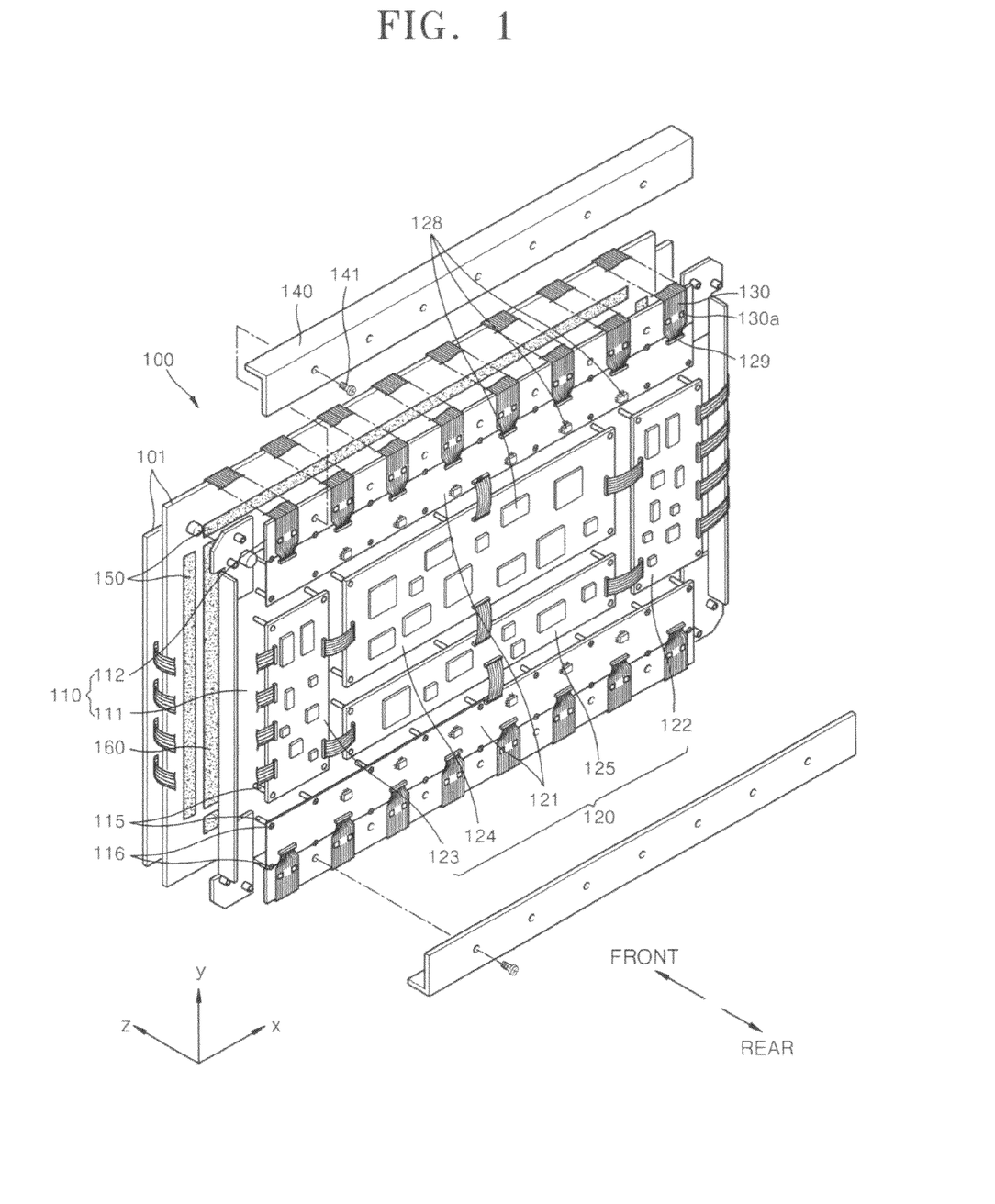
FIG. 1 illustrates an exploded perspective view of a plasma display module according to an embodiment of the present invention.
Figure 2:
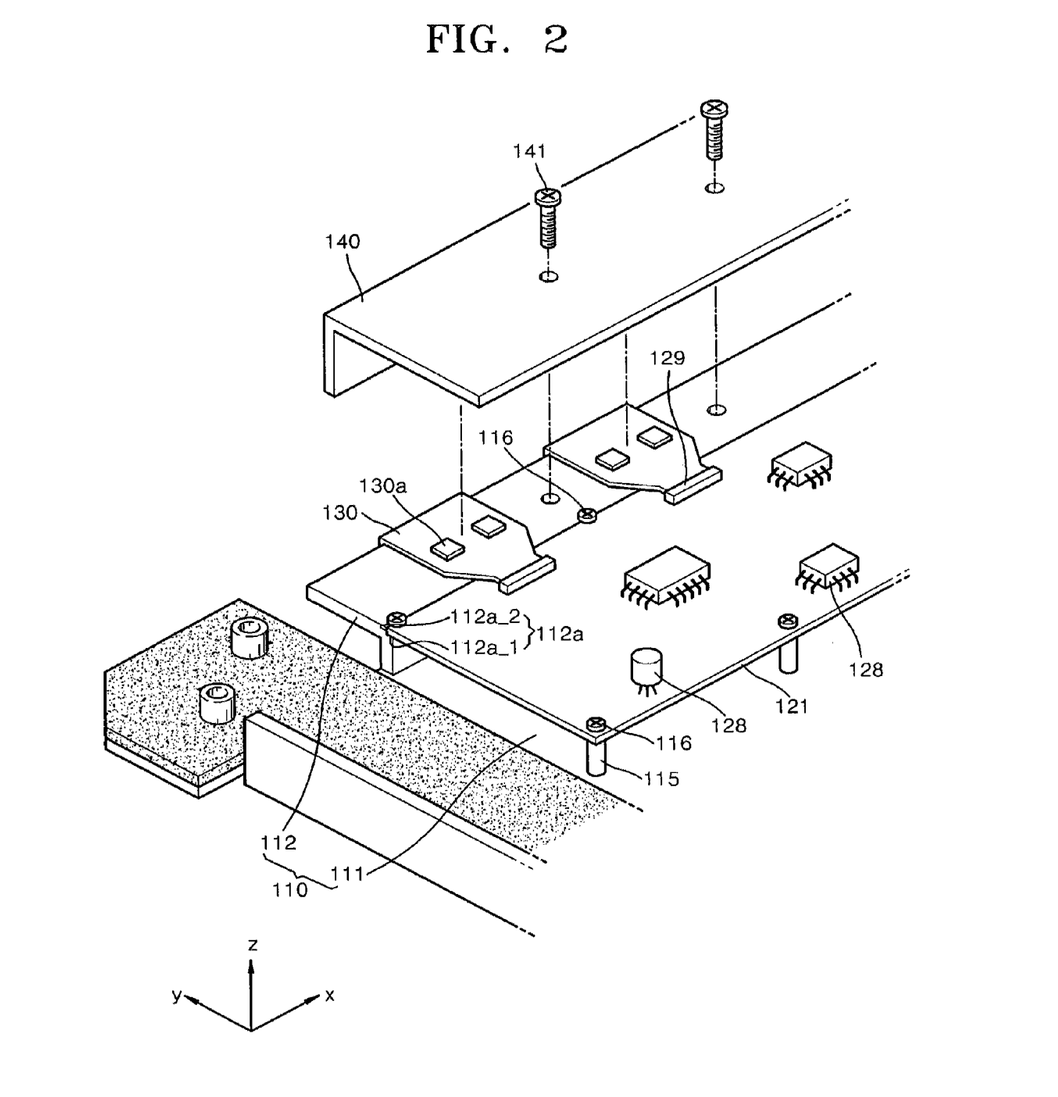
FIG. 2 illustrates an exploded perspective view of an address electrode buffer circuit board on a chassis of the plasma display module of FIG. 1.

FIG. 1 illustrates an exploded perspective view of a plasma display module 100 according to an exemplary embodiment of the present invention. FIG. 2 illustrates an exploded perspective view of an address electrode buffer circuit board 121 of the plasma display module 100 of FIG. 1. It is noted, however, that even though FIGS. 1-2 illustrate a plasma display module, other types of FPDs, e.g., a LCD module, a FED module, a VFD module, and so forth, are within the scope of the present invention.

Referring to FIGS. 1-2, the plasma display module 100 may include a plasma display panel (PDP) 101 displaying an image, a chassis 110, a circuit board 120, signal transmitting units 130, and a cover plate 140.

The PDP 101 may be mounted on a front surface of the chassis 110 using, e.g., a dual-sided adhesive 150 attached between a rear surface of the PDP 101 and a front surface of the chassis 110. A heat dissipating sheet 160 having high thermal conductivity may be interposed between the PDP 101 and the chassis 110, and may dissipate heat generated during operation of the PDP 101 to the chassis 110.

Figure 3:
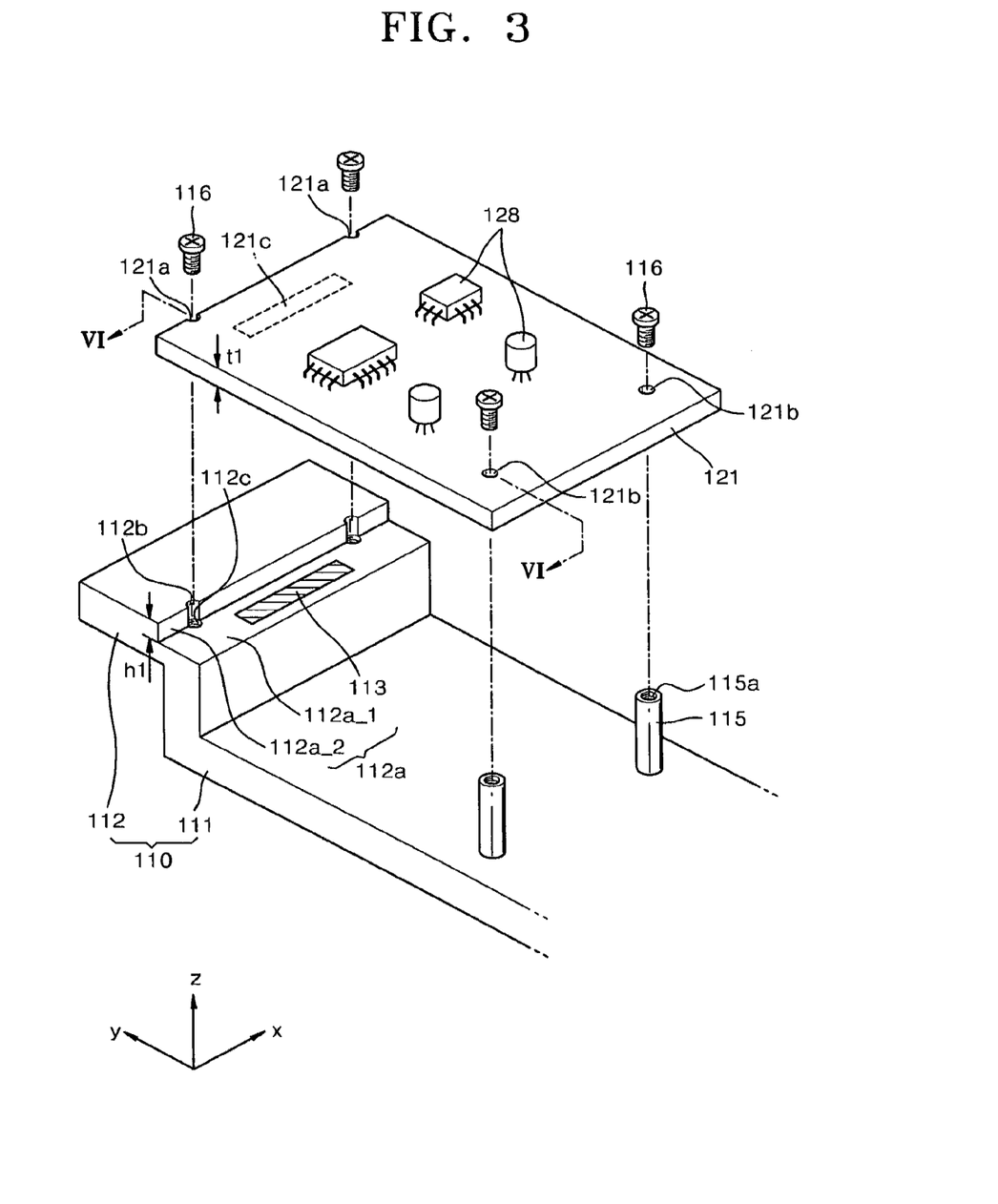
FIG. 3 illustrates an exploded perspective view of the address electrode buffer circuit board of FIG. 2 separated from the chassis.
Figure 4:
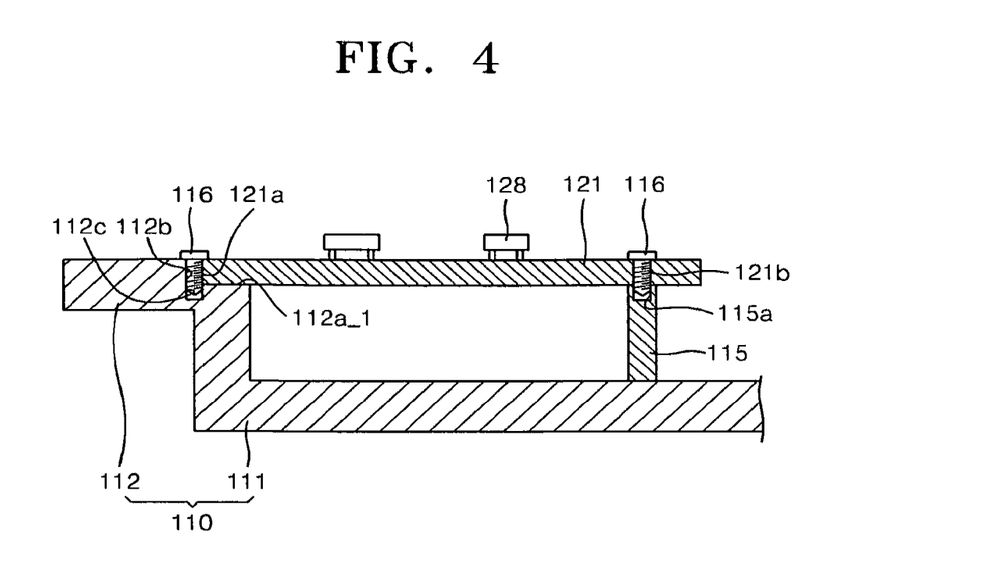
FIG. 4 illustrates a cross-sectional view along line VI-VI of FIG. 3.

The chassis 110 of the plasma display module 100 may support the PDP 101, and may be formed of metal having high rigidity and high electric conductivity, e.g., aluminum or iron, or of plastic. In addition, the chassis 110 may enable grounding of the circuit board 120. Accordingly, if the chassis 110 is formed of plastic, an additional grounding structure may be required on the chassis 110 to provide proper grounding for the circuit board 120. The chassis 110 may include a chassis base 111 and a chassis bending portion 112.

The chassis base 111 may be substantially planar, and may be a center portion of the chassis 110. The chassis base 111 may be on a rear surface of the PDP 101, and may include bosses 115. The chassis bending portion 112 may be integral with the chassis base 111, and may be attached along at least one edge of the chassis base 111. The chassis bending portion 112 may be a peripheral portion of the chassis 110. For example, one chassis bending portion 112 may be attached along a single peripheral edge of the chassis base 111 or multiple chassis bending portions 112 may be attached along multiple edges of the chassis base 111, e.g., along four edges of the chassis base 111. The chassis bending portion 112 may be in the xy-plane, e.g., parallel to the PDP 101, and may extend from an edge of the chassis base 111 in an upward direction away from the PDP 101. The chassis bending portion 112 will be described in more detail below with reference to FIGS. 3-4.

The circuit board 120 of the plasma display module 100 may drive the PDP 101, and may include an address electrode buffer circuit board 121, a X electrode driving circuit board 122, a Y electrode driving circuit board 123, a power supply board 124, and a logic control board 125. A plurality of circuit elements 128 may be arranged on the circuit board 120.

One or more of the X electrode driving circuit board 122, Y electrode driving circuit board 123, power supply board 124, logic control board 125, and/or address electrode buffer circuit board 121 may be attached to the chassis 110 both via the bosses 115 and via the chassis bending portion 112. For example, as illustrated in FIG. 2 with respect to the address electrode buffer circuit board 121, a first part of the address electrode buffer circuit board 121 may be mounted on the chassis bending portion 112, and a second part of the address electrode buffer circuit board 121 may be mounted on the bosses 115. Accordingly, space of the chassis 110 occupied by the address electrode buffer circuit board 121 may be minimized, i.e., due to overlap with an element extending away from the chassis 110, and a number of bosses 115 used to attach the address electrode buffer circuit board 121 to the chassis 110 may be minimized.

For example, at least a part of each of the X electrode driving circuit board 122, the Y electrode driving circuit board 123, the power supply board 124, or the logic control board 125 may be mounted on a respective chassis bending portion 112 (not shown). Alternatively, if multiple chassis bending portions 112 are formed in the chassis 110, the address electrode buffer circuit board 121 may be mounted entirely on the chassis bending portions 112. Attachment of the electrode buffer circuit board 121 to the chassis 110 will be described in more detail below with reference to FIGS. 3-4.

The signal transmitting units 130 of the plasma display module 100 may transmit signals between the circuit board 120 and the PDP 101, and may be disposed over the chassis bending portion 112. For example, as illustrated in FIGS. 1-2, the signal transmitting units 130 may transmit address signals from the address electrode buffer circuit board 121, so one end of each signal transmitting units 130 may be connected to a connector 129 on a rear surface of the address electrode buffer circuit board 121 and another end of each of the signal transmitting units 130 may be connected to the PDP 101. The signal transmitting units 130 may be, e.g., tape carrier packages (TCPs), chips on film (COFs), and so forth.

The cover plate 140 of the plasma display module 100 may be mounted on the chassis bending portion 112 using, e.g., cover plate mounting bolts 141. The cover plate 140 may protect the signal transmitting units 130, and may effectively dissipate heat generated by integrated circuits (ICs) 130a mounted on the signal transmitting units 130.

The chassis bending portion 112 of the chassis 110 will be explained in more detail below with reference to FIGS. 3-4. FIG. 3 illustrates an exploded perspective view of the address electrode buffer circuit board 121 of FIG. 2. For convenience of explanation, the signal transmitting units 130, the cover plate 140, the connectors 129, and a part of the chassis 110 are not illustrated in FIG. 3. FIG. 4 illustrates a cross-sectional view along line VI-VI of FIG. 3.

Figure 5:
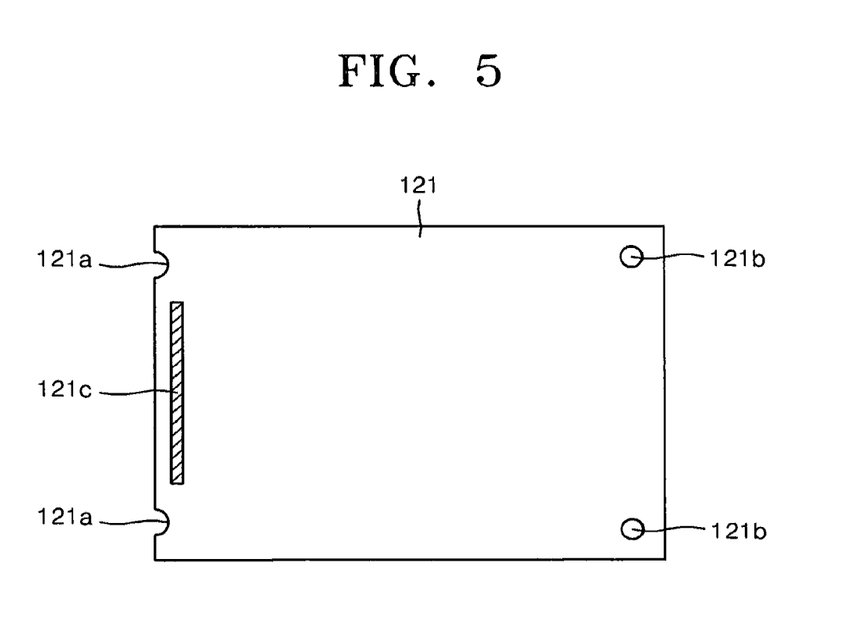
FIG. 5 illustrates a view of a rear surface of the address electrode buffer circuit board of FIG. 3.

Referring to FIG. 3, one part of the address electrode buffer circuit board 121 may be installed on the chassis bending portion 112, and another part of the address electrode buffer circuit board 121 may be installed on the bosses 115. Accordingly, the address electrode buffer circuit board 121 may include installation grooves 121a in a first side surface thereof and installation holes 121b in a second side surface opposite the first surface, as illustrated in FIG. 5. The installation holes 121b may correspond, i.e., aligned, to positions of the bosses 115. Accordingly, the one part of the address electrode buffer circuit board 121 installed on the chassis bending portion 112 may be attached thereto via bolts 116 inserted through the installation grooves 121a in the first side surface. The other part of the address electrode buffer circuit board 121 installed on the bosses 115 may be attached thereto via bolts 116 inserted through the installation holes 121b in the second side surface into the bosses 115.

In order to install a part of the address electrode buffer circuit board 121 on the chassis bending portion 112, a seating portion 112a may be formed in the chassis bending portion 112. More specifically, as illustrated in FIG. 3, the seating portion 112a may include a first surface 112a_1 and a second surface 112a_2. The first surface 112a_1 may be perpendicular to the second surface 112a_2, and a height h1 of the second surface 112a_2 as measured from the first surface 112a_1 in an upward direction along the z-axis, i.e., a depth of the seating portion 112a, may substantially equal a thickness t1 of the address electrode buffer circuit board 121, as measured along the z-axis. Accordingly, the address electrode buffer circuit board 121 may be placed on the first surface 112a_1 of the seating portion 112a parallel to the chassis base 111 and in contact with the second surface 112a_2, so a rear surface of the address electrode buffer circuit board 121 may be level, i.e., coplanar, with a rear surface of the chassis bending portion 112. The seating portion 112a may further include a ground portion 113, mounting grooves 112b, and mounting holes 112c.

The ground portion 113 may be formed on the first surface 112a_1 of the seating portion 112a in any suitable shape or location. For example, the ground portion 113 may have a rectangular shape in a center of the first surface 112a_1, as illustrated in FIG. 3. When the address electrode buffer circuit board 121 is mounted on the seating portion 112a, the ground portion 113 on the first surface 112a_1 may contact a circuit ground portion 121c formed on a front surface of the address electrode buffer circuit board 121, as illustrated in FIG. 3. The contact between the ground portion 113 and the circuit ground portion 112c may electrically connect circuits of the address electrode buffer circuit board 121 to the ground portion 113, thereby grounding circuits of the address electrode buffer circuit board 121 that require grounding. It is further noted that while the ground portion 113 is illustrated on the first surface 112a_1 in FIG. 3, other grounding configurations, e.g., the circuit ground portion 121c may directly contact the first surface 112a_1 or the second surface 112a_2 to achieve grounding, are within the scope of the present invention. The ground portion 113 may be advantageous in having an increased surface area on the seating portion 112a, so electrical contact between elements requiring grounding may be improved.

The mounting grooves 112b may be formed in the second surface 112a_2 of the seating portion 112a, as illustrated in FIG. 3, and may correspond to the installation grooves 121a. In other words, when the address electrode buffer circuit board 121 is mounted on the seating portion 112a, the mounting grooves 112b may face the installation grooves 121a to form spaces through which the bolts 116 may be inserted, as illustrated in FIG. 4. As such, the spaces formed by the mounting grooves 112b and installation grooves 121a may replace some bosses, so a number of bosses may be minimized in the plasma display module 100.

The mounting holes 112c may be formed in the chassis bending portion 112. More specifically, the mounting holes 112c may be formed in the first surface 112a_1 of the chassis bending portion, so the mounting grooves 112b may align with a portion of the mounting holes 112c. As such, the mounting grooves 112b may act as entrances of the mounting holes 112c. A thread may be formed on an inner circumferential surface of each of the mounting holes 112c, such that the bolts 116 may engage the threads of the mounting holes 112c when the circuit board 121 is mounted on the seating portion 112a.

While the mounting grooves 112b may be formed in the chassis bending portion 112 and the installation grooves 121a may be formed in the address electrode buffer circuit board 121 to form the spaces through which the bolts 116 can pass in FIG. 3, the present embodiment may not be limited thereto. For example, the mounting grooves 112b may not be formed in the chassis bending portion 112 and the installation grooves 121a may not be formed in the address electrode buffer circuit board 121. In this case, since only the installation holes 121b are formed in the address electrode buffer circuit board 121 and only the mounting holes 112c are formed in the chassis bending portion 112, the address electrode buffer circuit board 121 may be mounted on the chassis bending portion 112 by passing the bolts 116 through the installation holes 121b into the mounting holes 112c.

A process of mounting the address electrode buffer circuit board 121 on the chassis 110 will now be explained. Referring to FIGS. 3-4, one part of the address electrode buffer circuit board 121 may be placed on the seating portion 112a, and another part of the address electrode buffer circuit board 121 may be placed on the bosses 115. The one part of the address electrode buffer circuit board 121 on the chassis bending portion 112 may be mounted by adjusting the installation grooves 121a and the mounting grooves 112b to substantially accurately face each other, so the bolts 116 may be inserted through the resultant spaces into the mounting holes 112c. Similarly, the other part of the address electrode buffer circuit board 121 on the bosses 115 may be mounted by aligning the installation holes 121b with holes 115a of the bosses 115, so the bolts 116 may be inserted therethrough into the bosses 115.

The operation of the plasma display module 100 may be as follows. When the plasma display module 100 is operated, the circuit board 120 may be driven to apply a voltage to the PDP 101. When the voltage is applied to the PDP 101, an address discharge and a sustain discharge may be generated, so an energy level of discharge gas excited by the sustain discharge in the PDP 101 may be lowered to emit ultraviolet (UV) light. The UV light may excite phosphors of phosphor layers (not shown) coated on inner walls of discharge cells (not shown) in the PDP 101, so energy levels of the excited phosphors may be lowered to emit visible light to form images.

Like other circuit boards, the address electrode buffer circuit board 121 may require grounding. Since the circuit ground portion 121c of the address electrode buffer circuit board 121 may contact the ground portion 113 on the chassis bending portion 112, a wide ground area may be created and stable grounding may be achieved. As a result, the address electrode buffer circuit board 121 may be well grounded and erroneous operation of the PDP 101 may be prevented or substantially minimized.

Further, the electrode buffer circuit board 121 may be attached to the chassis bending portion 112, which extends in an upward direction away from the PDP 101, so an area of the address electrode buffer circuit board 121 usable to form circuits may be increased. As a result, efficient space utilization may be achieved when circuits are arranged on the plasma display module 100 at different design and manufacturing stages.

Figure 6:
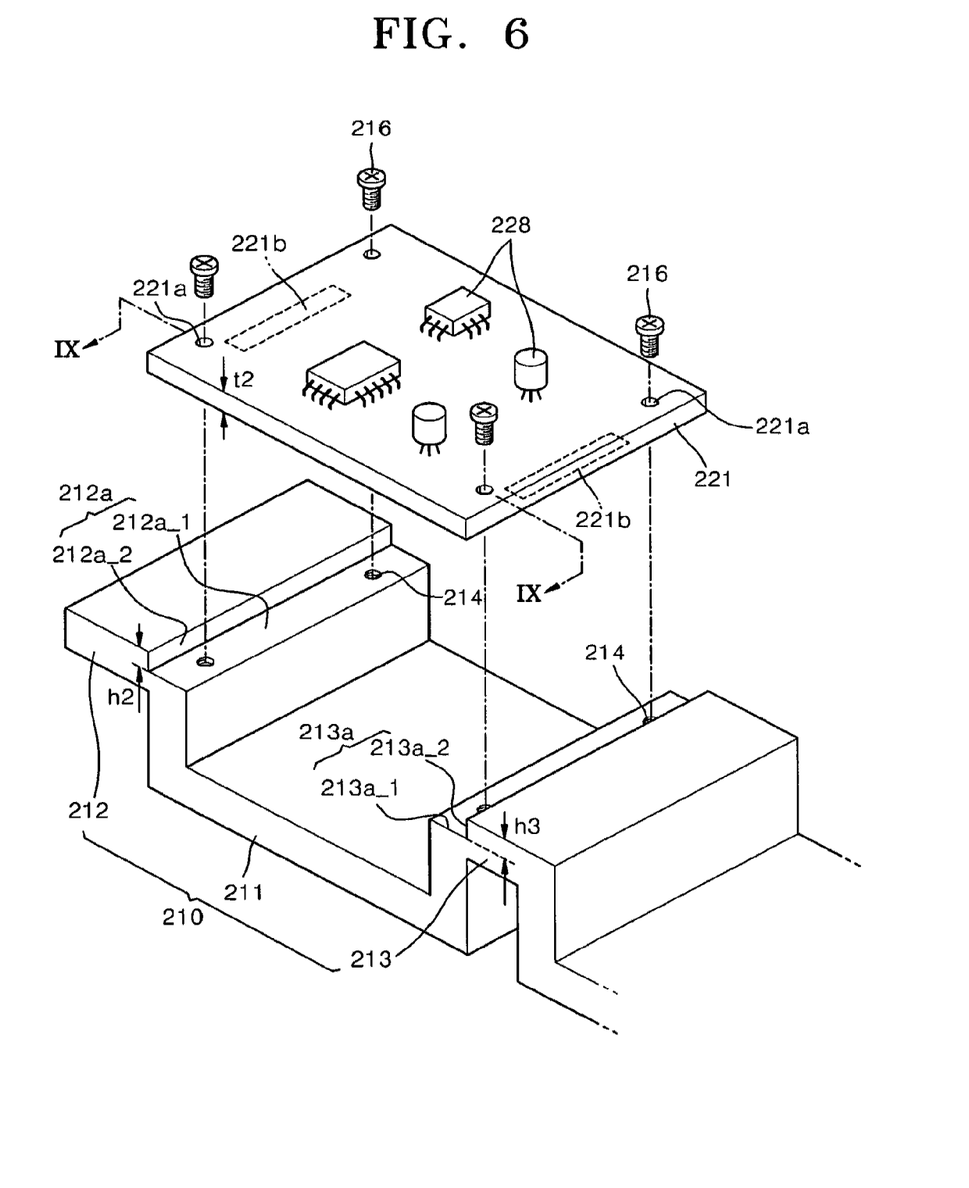
FIG. 6 illustrates an exploded perspective view of an address electrode buffer circuit board according to another embodiment of the present invention.
Figure 7:
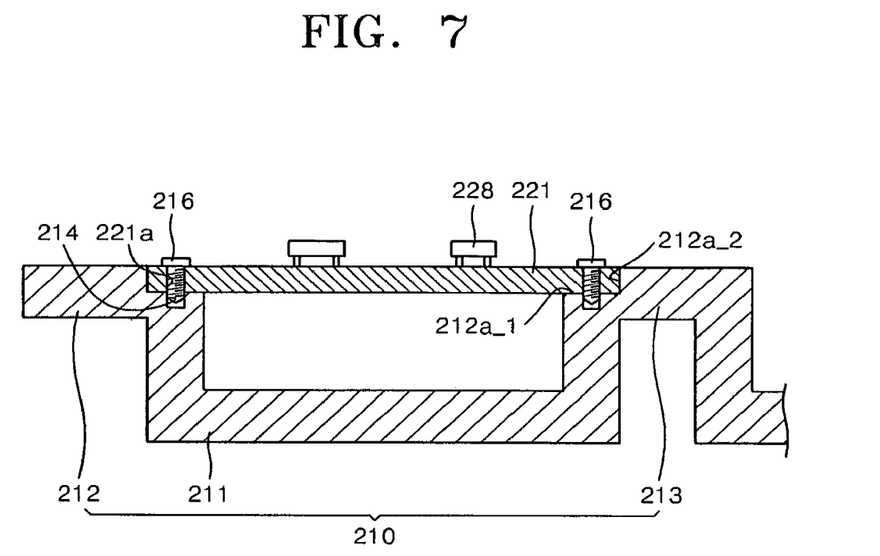
FIG. 7 illustrates a cross-sectional view along line IX-IX of FIG. 6.

According to another embodiment of the present invention, a plasma display module will now be explained with reference to FIGS. 6-7 by focusing on differences between the embodiment of the plasma display module 100 of FIG. 1 and the plasma display module illustrated in FIGS. 6-7. The plasma display module illustrated in FIGS. 6-7 may be substantially similar to the plasma display module 100, with the exception of including two bending portions in the chassis base. FIG. 6 illustrates an exploded perspective view of an address electrode buffer circuit board 221 of a plasma display module, and FIG. 7 illustrates a cross-sectional view along line IX-IX of FIG. 6. For convenience of explanation, a signal transmitting unit, a cover plate, connectors, and a part of a chassis are not illustrated in FIG. 6.

Referring to FIGS. 6-7, the plasma display module may include a chassis 210 having a chassis base 211, a first chassis bending portion 212, and a second chassis bending portion 213. The chassis base 211 may be substantially similar to the chassis base 111 of the plasma display module 100 described previously with reference to FIGS. 1-5, and therefore, its detailed description will not be repeated.

The first chassis bending portion 212 may include a first seating portion 212a having a first surface 212a_1 and a second surface 212a_2, and may be substantially similar to the chassis bending portion 112 of the plasma display module 100 described previously with reference to FIGS. 1-5, and therefore, its detailed description will not be repeated. The depth of the first seating portion 212a, i.e., a height h2 of the second surface 212a_2, may substantially equal a thickness t2 of the address electrode buffer circuit board 221.

The second chassis bending portion 213 may be positioned opposite the first chassis bending portion 212. For example, if the first chassis bending portion 212 is positioned in close proximity to an edge of the chassis 211, e.g., adjacent to an edge of the plasma display module 100, the second chassis bending portion 213 may be spaced apart from the edge of the chassis base 211. Each of the first chassis bending portion 212 and the second chassis bending portion 213 may be bent away in an opposite direction with respect to each other, and may have respective seating portions 212a and 213a with depths h2 and h3, respectively. The depths h2 and h3 may substantially equal each other, and may substantially equal a thickness t2 of the address electrode buffer circuit board 221. The second seating portion 213a may include a third surface 213a_1 and a fourth surface 213a_2. The second chassis bending portion 213 and the chassis base 211 may form a "Π" shape, as illustrated in FIG. 7. For example, the second chassis bending portion 213 may be formed by bending a part of the chassis base 211. The first and second chassis bending portions 212 and 213 may have a substantially same height, e.g., rear surfaces of the first and second chassis bending portions 212 and 213 may be coplanar.

Accordingly, one part of the address electrode buffer circuit board 221 may be installed on the first chassis bending portion 212, and the other part of the address electrode buffer circuit board 221 may be installed on the second chassis bending portion 213. More specifically, one end of the address electrode buffer circuit board 221 may be positioned in the first seating portion 212a of the first chassis bending portion 212, and an opposite end of the address electrode buffer circuit board 221 may be positioned in the second seating portion 213a of the second chassis bending portion 213. Mounting holes 214 may be formed in the first surface 212a_1 and the third surface 213a_1, and installation holes 221a may be formed in the address electrode buffer circuit board 221 corresponding in position to the mounting holes 214. A thread may be formed on an inner circumferential surface of each of the mounting holes 214, so bolts 216 may be inserted through the installation holes 221a into the mounting holes 214, and may engage the threads of the mounting holes 214 when the address electrode buffer circuit board 221 is mounted on the first and second seating portions 212a and 213a. Circuit elements 228 may be disposed on the address electrode buffer circuit board 221.

Circuit ground portions 221b may be formed on a front surface of the address electrode buffer circuit board 221, and may be electrically connected to the first surface 212a_1 and/or the third surface 213a_1 to achieve grounding. For example, the circuit ground portions 221b may be in direct contact with the first surface 212a_1 and/or the third surface 213a_1 to ground circuits of the address electrode buffer circuit board 221, i.e., circuits of the address electrode buffer circuit board 221 requiring grounding.

A process of mounting the address electrode buffer circuit board 221 on the chassis 210 will now be explained. The address electrode buffer circuit board 221 may be mounted on the first and second chassis bending portions 212 and 213, and may be adjusted by aligning the installation holes 221a with the mounting holes 214, and by passing the bolts 216 through the installation holes 221a into the mounting holes 214.

As described above, since the circuit ground portions 221b of the address electrode buffer circuit board 221 may contact the first chassis bending portion 212 and/or the second chassis bending portion 213, a wide ground area may be formed and stable grounding may be achieved. As a result, the address electrode buffer circuit board 221 may be well grounded, so erroneous operation may be prevented or substantially minimized. Further, the first chassis bending portion 212 may extend away from the chassis base 211, an overall usable area of the chassis 210 may be increased and efficient space utilization may be achieved, e.g., the address electrode buffer circuit board 221 may extend along the first chassis bending portion 212. It further noted that even though a mounting structure for the address electrode buffer circuit board 221 is described herein, the mounting structure may be applied to other circuit boards, e.g., an X electrode driving circuit board, a Y electrode driving circuit board, a power supply board, and/or a logic control board. The configuration, operation, and effect of the plasma display module of FIGS. 6-7 are substantially similar to those of the plasma display module 100 of FIG. 1, and thus, will not be repeated.

Figure 8:
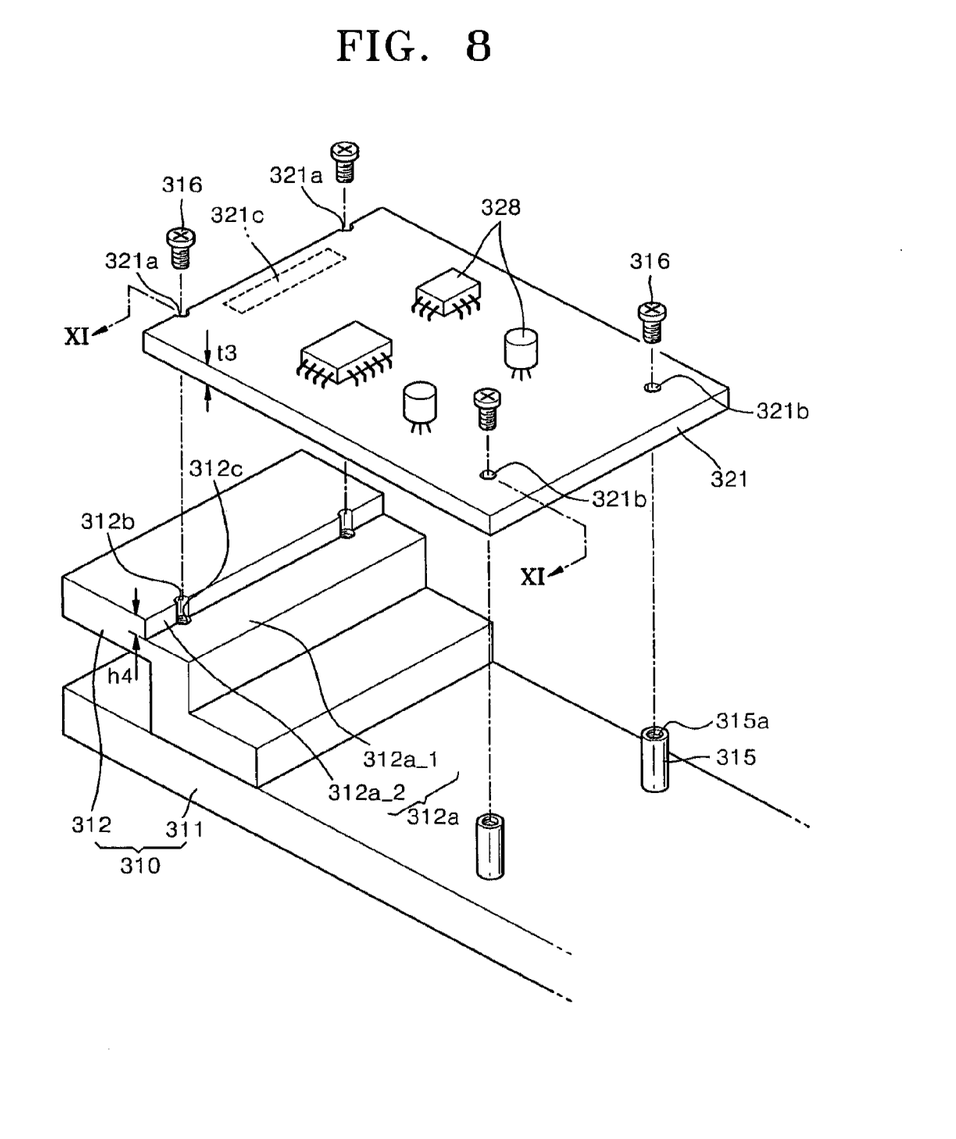
FIG. 8 illustrates an exploded perspective view illustrating an address electrode buffer circuit board according to another embodiment of the present invention.
Figure 9:
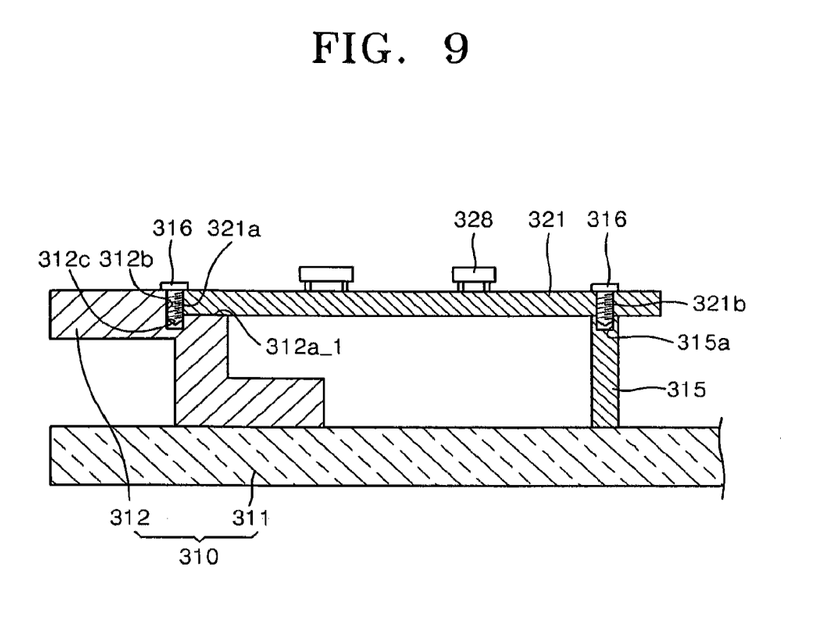
FIG. 9 illustrates a cross-sectional view along line XI-XI of FIG. 8.

According to another embodiment of the present invention, a plasma display module will now be explained with reference to FIGS. 8-9 by focusing on differences between the embodiment of the plasma display module 100 of FIG. 1 and the plasma display module illustrated in FIGS. 8-9. The plasma display module illustrated in FIGS. 8-9 may be substantially similar to the plasma display module 100, with the exception of including a reinforcing member instead of a chassis bending portion. FIG. 8 illustrates an exploded perspective view of an address electrode buffer circuit board 321 of a plasma display module, and FIG. 9 illustrates a cross-sectional view along line XI-XI of FIG. 8. For convenience of explanation, a signal transmitting unit, a cover plate, connectors, and a part of a chassis are not illustrated in FIG. 8.

Referring to FIGS. 8-9, the plasma display module may include a chassis 310 having a chassis base 311 and a reinforcing member 312. Each of the chassis base 311 and the reinforcing member 312 may be formed of metal, e.g., aluminum or iron, having high rigidity and high electric conductivity, and may enable grounding of the address electrode buffer circuit board 321. The chassis base 311 may be substantially similar to the chassis base 111 of the plasma display module 100 described previously with reference to FIGS. 1-5, and therefore, its detailed description will not be repeated.

The reinforcing member 312 may be disposed at an edge of the chassis 310, and may be mounted on the chassis base 311 by, e.g., welding, soldering, or TOX®. A height of the reinforcing member 312 may substantially equal a height of the address electrode buffer circuit board 321. The reinforcing member 312 may have any suitable shape enabling mounting the circuit board 321 thereon. For example, the reinforcing member 312 may have a substantially same shape as the chassis bending portion 112. In another example, the reinforcing member 312 may have a step structure, as illustrated in FIG. 9, so a first portion thereof may be positioned on the chassis base 311, a second portions thereof may extend between the chassis base 311 and the address electrode buffer circuit board 321, and a third portion thereof may extend away from the address electrode buffer circuit board 321 in parallel to the chassis base 311.

One part of the address electrode buffer circuit board 321 may be installed on the reinforcing member 312, and the other part of the address electrode buffer circuit board 321 may be installed on bosses 315 forcibly inserted into the chassis base 311. In order to install the address electrode buffer circuit board 321 on the reinforcing member 312, a seating portion 312a may be formed in the reinforcing member 312. The seating portion 312a may include a first surface 312a_1 and a second surface 312a_2. The depth of the seating portion 312a, i.e., a height h4 of the second surface 312a_2, may substantially equal a thickness t3 of the address electrode buffer circuit board 321.

Circuit elements 328 may be disposed on a rear surface of the address electrode buffer circuit board 321. Installation grooves 321a may be formed in a side surface of the address electrode buffer circuit board 321, and mounting grooves 312b may be formed in the second surface 312a_2 of the seating portion 312a corresponding to the installation grooves 321a. When the address electrode buffer circuit board 321 is mounted on the seating portion 312a, the mounting grooves 312b may face the installation grooves 321a to form spaces through which bolts 316 may be inserted. The installation grooves 321a may be formed on a side of the address electrode buffer circuit board 321 to be mounted on the reinforcing member 312.

Mounting holes 312c may be formed in the reinforcing member 312. The mounting holes 312c may pass through the first surface 312a_1, and the mounting grooves 312b may act as entrances of the mounting holes 312c. A thread may be formed on an inner circumferential surface of each of the mounting holes 312c, such that the bolts 316 may engage the threads of the mounting holes 312c when the address electrode buffer circuit board 321 is mounted on the reinforcing member 312.

Installation holes 321b may be formed in the address electrode buffer circuit board 321 opposite the installation grooves 321a. The installation holes 321b may correspond in position to the bosses 315 forcibly inserted into the chassis base 311. Accordingly, the other part of the address electrode buffer circuit board 321 may be mounted on the bosses 315 by passing the bolts 316 through the installation holes 321b into the bosses 315.

While the mounting grooves 312b may be formed in the reinforcing member 312 and the installation grooves 321a may be formed in the address electrode buffer circuit board 321, the present embodiment may be not limited thereto. For example, the mounting grooves 312b may not be formed in the reinforcing member 312 and the installation grooves 321a may not be formed in the address electrode buffer circuit board 321, so only the installation holes 321b may be formed in the address electrode buffer circuit board 321 and only the mounting holes 312c may be formed in the reinforcing member 312. Accordingly, the address electrode buffer circuit board 321 may be mounted on the reinforcing member 312 by passing the bolts 316 through the installation holes 321b and inserting the bolts 316 into the mounting holes 312c.

A circuit ground portion 321c may be formed on a bottom surface of the address electrode buffer circuit board 321, and may be electrically connected to circuits of the address electrode buffer circuit board 321. The circuit ground portion 321c may directly contact the first surface 312a_1 to achieve grounding.

A process of mounting the address electrode buffer circuit board 321 on the chassis 310 will now be explained. The address electrode buffer circuit board 321 may be mounted on the seating portion 312a and on the bosses 315. The address electrode buffer circuit board 321 may be adjusted by aligning the installation grooves 321a and the mounting grooves 312b to face each other, so the bolts 316 may be inserted into the mounting holes 312c, and by aligning the installation holes 321b with holes 315a of the bosses 315, so the bolts 316 may be inserted into the bosses 315.

As described above, since the circuit ground portion 321c of the address electrode buffer circuit board 321 may contact the reinforcing member 312, a wide ground area may be formed and stable grounding may be achieved. As a result, the address electrode buffer circuit board 321 may be well grounded, so erroneous operation may be prevented or substantially minimized. Further, since the address electrode buffer circuit board 321 may extend up to the reinforcing member 312, an area of the address electrode buffer circuit board 321 usable to form circuits may be increased. As a result, efficient space utilization may be achieved when circuits are arranged on the modified plasma display module at different design and manufacturing stages. It is further noted that, even though a mounting structure for the address electrode buffer circuit board 221 is described herein, the mounting structure may be applied to other circuit boards, e.g., an X electrode driving circuit board, a Y electrode driving circuit board, a power supply board, and/or a logic control board. The configuration, operation, and effect of the plasma display module of FIGS. 8-9 are substantially similar to those of the plasma display module 100 of FIG. 1, and thus, will not be repeated herein.

A FPD according to embodiments of the present invention may be advantageous in providing a seating portion in a chassis, so a circuit board may be mounted on the seating portion. Such a configuration may improve space efficiency of the circuit board and stable grounding thereof.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display module, comprising:
 a display panel;
 a chassis configured to support the display panel, the chassis having a chassis base and at least one first extending portion attached to the chassis base, the first extending portion being parallel to the display panel and extending away from the chassis base, the first extending portion including a seating portion having a predetermined depth; and
 a circuit board configured to drive the display panel, at least one part of the circuit board being mounted on the seating portion of the first extending portion.

2. The flat panel display module as claimed in claim 1, wherein the display panel is a plasma display panel.

3. The flat panel display module as claimed in claim 1, wherein the circuit board is an address electrode buffer circuit board.

4. The flat panel display module as claimed in claim 1, wherein the circuit board is mounted on the seating portion with bolts.

5. The flat panel display module as claimed in claim 4, wherein the first extending portion includes mounting holes, each mounting hole including a thread on at least a portion of an inner circumferential surface thereof, and the bolts being screwed into the mounting holes.

6. The flat panel display module as claimed in claim 5, wherein the circuit board includes installation grooves and the first extending portion includes mounting grooves corresponding to the installation grooves, the mounting grooves being connected to the mounting holes.

7. The flat panel display module as claimed in claim 5, wherein the circuit board includes installation holes corresponding to the mounting holes.

8. The flat panel display module as claimed in claim 5, wherein at least a part of each of the mounting holes is in the seating portion.

9. The flat panel display module as claimed in claim 1, wherein the circuit board includes a circuit ground portion, the circuit ground portion being in contact with the seating portion.

10. The flat panel display module as claimed in claim 9, wherein the circuit ground portion is in direct contact with the seating portion.

11. The flat panel display module as claimed in claim 9, wherein the circuit ground portion is in direct contact with a grounding portion on a surface of the seating portion.

12. The flat panel display module as claimed in claim 1, wherein the first extending portion is integral with the chassis base.

13. The flat panel display module as claimed in claim 1, wherein the first extending portion is a separate reinforcing member on a rear surface of the chassis base opposite a front surface of the chassis base, the front surface supporting the display panel.

14. The flat panel display module as claimed in claim 13, wherein the reinforcing member has a step structure.

15. The flat panel display module as claimed in claim 1, further including a second extending portion, the second extending portion including a seating portion.

16. The flat panel display module as claimed in claim 15, wherein the second extending portion is opposite the first extending portion.

17. The flat panel display module as claimed in claim 16, wherein at least a part of the circuit board is mounted on the seating portion of the second extending portion.

18. The flat panel display module as claimed in claim 1, wherein the seating portion includes first and second surfaces, the first and second surfaces being perpendicular to each other.

19. The flat panel display module as claimed in claim 18, wherein the circuit board mounted on the seating portion of the first extending portion is in direct contact with both the first and second surfaces of the seating portion.

20. The flat panel display module as claimed in claim 1, wherein a rear surface of the circuit board is level with a rear surface of the first extending portion.

* * * * *